United States Patent
Knight et al.

(10) Patent No.: US 9,252,182 B2
(45) Date of Patent: Feb. 2, 2016

(54) INFRARED MULTIPLIER FOR PHOTO-CONDUCTING SENSORS

(75) Inventors: Thomas J. Knight, Silver Spring, MD (US); Christopher F. Kirby, Gambrills, MD (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 308 days.

(21) Appl. No.: 13/603,788

(22) Filed: Sep. 5, 2012

(65) Prior Publication Data

US 2014/0061833 A1    Mar. 6, 2014

(51) Int. Cl.
*H01L 31/0216* (2014.01)
*H01L 31/0232* (2014.01)
*H01L 27/146* (2006.01)
*G01J 5/08* (2006.01)

(52) U.S. Cl.
CPC .......... *H01L 27/1467* (2013.01); *G01J 5/0853* (2013.01); *H01L 31/0232* (2013.01); *H01L 31/02161* (2013.01)

(58) Field of Classification Search
CPC .................. H01L 21/02417; H01L 21/02485; H01L 21/0256; H01L 31/00–31/208; H01L 27/1467; H01L 31/02161; H01L 31/0232
USPC .................. 257/432, 233, 292, 293, E31.029
See application file for complete search history.

(56) References Cited

U.S. PATENT DOCUMENTS

| | | | |
|---|---|---|---|
| 4,970,567 A * | 11/1990 | Ahlgren et al. | 257/442 |
| 5,521,123 A * | 5/1996 | Komatsu et al. | 438/64 |
| 5,561,295 A | 10/1996 | Jacksen et al. | |
| 5,900,631 A | 5/1999 | Sano | |
| 6,157,042 A | 12/2000 | Dodd | |
| 6,355,939 B1 | 3/2002 | Dodd | |
| 6,509,066 B1 | 1/2003 | Jost | |
| 6,734,516 B2 | 5/2004 | Jacksen et al. | |
| 6,972,210 B2 | 12/2005 | Pourquier et al. | |
| 7,683,444 B2 | 3/2010 | Tonucci | |
| 2011/0155914 A1 * | 6/2011 | Ohhira et al. | 250/338.4 |
| 2011/0260062 A1 * | 10/2011 | Fujimoto et al. | 250/338.3 |
| 2012/0132804 A1 * | 5/2012 | Lee et al. | 250/330 |

FOREIGN PATENT DOCUMENTS

EP    1 852 920    11/2007

OTHER PUBLICATIONS

*Direct and indirect band gaps*, Wikipedia [online] [retrieved Jan. 6, 2012] Retrieved from the internet: <URL: http://en.wikipedia.org/wiki/Direct_bandgap>. (dated Dec. 16, 2011) 3 pages.

(Continued)

*Primary Examiner* — Davienne Monbleau
*Assistant Examiner* — Damon Hillman
(74) *Attorney, Agent, or Firm* — Alston & Bird LLP

(57) ABSTRACT

Photo-conducting infrared sensors are provided including a substrate (e.g., silicon) with one or more trenches formed on a first surface. An infrared-reflective film can be deposited directly or indirectly onto and conforming in shape with the first surface of the substrate. A lead chalcogenide film can be deposited directly or indirectly over the top of the infrared-reflective film and conforming in shape with the first surface of the substrate. Accordingly, the infrared-reflective film is directly or indirectly sandwiched between the substrate and the lead chalcogenide film.

20 Claims, 5 Drawing Sheets

(56) References Cited

OTHER PUBLICATIONS

*Focal Plane Array—InGaAs Products* [online] Retrieved Feb. 20, 2015 via the Internet Archive Wayback Machine at https://web.archive.org/web/20120106063559/http://www.sensorsinc.com/arrays.html (Jan. 6, 2012). 3 pages.
*Infrared detector*, Wikipedia [online] [retrieved Feb. 24, 2011] Retrieved from the internet: <URL: http://en.wikipedia.org/wiki/infrared_detector >. (dated Jan. 12, 2011) 2 pages.
*Infrared detector*, Wikipedia [online] [retrieved Jan. 6, 2012] Retrieved from the internet: <URL: http://en.wikipedia.org/wiki/Infrared_detector >. (dated Jan. 2, 2012) 1 page.
*Infrared detector formats* [online] Retrieved Feb. 20, 2015 via the Internet Archive Wayback Machine at https://web.archive.org/web/20120103143429/http://www.xenics.com/en/infrared_technology/infrared_detector_formats.asp (Jan. 3, 2012), 2 pages.
*Infrared glossary* [online] Retrieved Feb. 20, 2015 via the Internet Archive Wayback Machine at https://web.archive.org/web/20120103145537/http://www.xenics.com/en/infrared_technology/infrared_glossary.asp (Jan. 3, 2012), 3 pages.
*Lead(II) sulfide*, Wikipedia[online] Retrieved Feb. 20, 2015 via the Internet Archive Wayback Machine at https://web.archive.org/web/20110211063046/http://en.wikipedia.org/wiki/Lead(II)_sulfide (Feb. 11, 2011). 3 pages.
*Semiconductor*, Wikipedia [online] [retrieved Jan. 6, 2012] Retrieved from the internet: <URL: http://en.wikipedia.org/wiki/Semiconductor_material >. (dated Dec. 31, 2011) 8 pages.
*Staring array*, Wikipedia [online] [retrieved Jan. 6, 2012] Retrieved from the internet: <URL: http://en.wikipedia.org/wiki/Staring_array >. (dated Nov. 21, 2010) 2 pages.
*What is infrared radiation?* [online] [retrieved Jan. 6, 2012] Retrieved from the internet: <URL: http://xenics.com/en/infrared_technology/what_is_infrared_radiation.asp >. (2011) 2 pages.

\* cited by examiner

INFRARED MULTIPLIER FOR PHOTO-CONDUCTING SENSORS

TECHNICAL FIELD

The presently disclosed invention relates generally to photo-conducting sensors for detecting infrared radiation and, more particularly, to infrared photo-conducting sensors exhibiting improved quantum efficiency.

BACKGROUND

Generally speaking, infrared photo-conductor sensors essentially provide an electrical response to infrared radiation. Such sensors, therefore, convert infrared radiation into a measurable form (e.g., current, voltage, etc.). The detected energy can be translated into imagery illustrating energy differences between objects, thus enabling perception or identification of an otherwise obscured scene. That is, the electrical response can be measured, digitized, and used to construct an image or an object, scene, or phenomenon that emits the infrared radiation.

Despite not being visibly perceptible to the naked eye, infrared radiation is ever present in our natural environment. In fact, any matter that generates heat emits infrared radiation. Within the spectrum of electromagnetic radiation, infrared radiation has wavelengths ranging from 0.75-3 micron (shortwave infrared)(SWIR), 3-5 micron (midwave infrared)(MWIR), 8-14 micron (longwave infrared)(LWIR), and 14-1000 micron (far infrared).

Infrared photo-conductor sensors can be provided in a variety of general formats including single element-detectors, linear arrays (e.g., a single row of individual detectors/pixels), and two-dimensional focal plane arrays (e.g., multiple rows and columns or individual detectors/pixels).

Many conventional infrared photo-conductor sensors are based on lead-salt sensing technology, such as lead sulfide (PbS), lead selenide (PbSe), and lead telluride (PbTe). Conventional infrared lead-salt focal plane arrays rely on photo-conductivity to convert photons into electrical current via free carrier absorption. The infrared lead salt (e.g., PbSe, PbS, PbTe) sensing technology itself was developed in Germany during World War II and is still used as a mid-IR sensors which does not require refrigeration.

However, due to the presence of noise in the form of both Generation-Recombination noise and 1/f noise, substantial signal conditioning is required. The supporting electronics include pre-amplification circuits and electronic chopping, thus requiring the use of large capacitors at each pixel. This approach undesirably complicates the entire system. For example, large pixel sizes of 60×60 microns are used hence limiting the resolution of the array.

In addition, the material characteristics themselves exhibit large variations in uniformity and consistency. The lack of adequate adhesion between the lead-salts and underlying layers is an additional shortcoming to such lead-salt based systems. Chemically-deposited lead-salt films, for instance, suffer from characteristically poor adhesion despite exhibiting, in some circumstances, notably larger response. This lack of adequate adhesion leads to catastrophic film delamination if not during the film preparation, then during the sensor fabrication process (e.g., fabrication of a focal plane array), in which even reasonably low process temperatures of 130° C. have been observed to destroy PbSe films. The poor film adhesion is, in part, subject to delamination because of the large differences in thermal expansion differences between lead-salts (e.g., PbSe—19 ppm/° C.) and, for example, a silicon (2.6 ppm/° C.) substrate. In the area of a single pixel of 2600 $\mu m^2$ in a conventional structure, for instance, there is minimal adhesion.

Accordingly, there continues to be an industrial need for lead-salt sensing technology having improved properties.

BRIEF SUMMARY

One or more embodiments of the present invention may address one or more of the aforementioned problems. Certain embodiments according to the present invention provide a substantial advance for infrared photo-conducting sensors, such as those based on lead selenide (PbSe), improving quantum efficiency (e.g., in certain embodiments by a factor of 3). Moreover, certain embodiments of the present invention also provide a dramatic improvement in addressing the lack of adequate film adhesion—a major weakness in chemically deposited lead-salt technology—by providing an increased surface area to which the lead-salt films can adhere. Accordingly, certain embodiments of the present invention circumvent the inherent material liabilities and improve the photo-response of lead-salt thin film detectors, such as lead-salt (e.g., PbSe, PbS, PbTe, etc.) photoconductor devices in focal plane arrays.

In one aspect, embodiments of the present invention provide infrared photo-conducting sensors including a substrate (e.g., silicon) comprising a first surface including one or more trenches formed therein. The formed trenches can be provided in a variety of depths, configurations, frequency, and steepness. Generally speaking, however, the trenches can include planar faces connecting ridges (e.g., outermost peaks of the formed trenches) to valleys positioned between respective ridges and recessed into the substrate by a selected depth. The planar faces are angled from the respective valleys of the trenches to the respective ridges. That is, the planar faces connecting the ridges and valleys are not perpendicular to a pre-surface topology formed surface (e.g., the generally flat outer surface prior to the formation of the trenches). An infrared-reflective film can be located/deposited directly or indirectly onto the first surface of the substrate (i.e., the surface having surface topology formed thereon). The infrared-reflective film can conform in shape with the first surface of the substrate. A lead chalcogenide (e.g., e.g., PbSe, PbS, PbTe) film can be located/deposited directly or indirectly over the top of the infrared-reflective film. Similar to the infrared-reflective film, the lead chalcogenide film can also conform in shape with the first surface of the substrate (i.e., the surface having surface topology formed thereon). In such embodiments, therefore, the infrared-reflective film is directly or indirectly sandwiched between the substrate and the lead chalcogenide film.

Additionally, embodiments of the present invention provide linear and focal plane arrays. In certain embodiments, focal plane arrays for detecting infrared radiation comprise a plurality of infrared detecting pixel structures. At least one of said plurality of infrared detecting pixel structures (and in certain embodiments all pixel structures) comprise a substrate comprising a first surface including one or more trenches (i.e., the surface has surface topology formed thereon in the form of various shaped trenches). An infrared-reflective film can be located/deposited directly or indirectly onto the first surface of the substrate (i.e., the surface having surface topology formed thereon) and can conform in shape with the first surface of the substrate. A lead chalcogenide (e.g., e.g., PbSe, PbS, PbTe) film can be located/deposited directly or indirectly over the top of the infrared-reflective film. Similar to the infrared-reflective film, the lead chalcogenide film can also conform in shape with the first surface of the substrate (i.e., the surface having surface topology formed thereon). In certain embodiments, the focal plane arrays include electrical couplers providing an electrical connection of each pixel structure to a measurement circuitry unit as is generally known by one of skill in the art.

BRIEF DESCRIPTION OF THE SEVERAL VIEWS OF THE DRAWING(S)

Having thus described embodiments of the invention in general terms, reference will now be made to the accompanying drawings, which are not necessarily to scale, and wherein:

DETAILED DESCRIPTION

Figure 1:
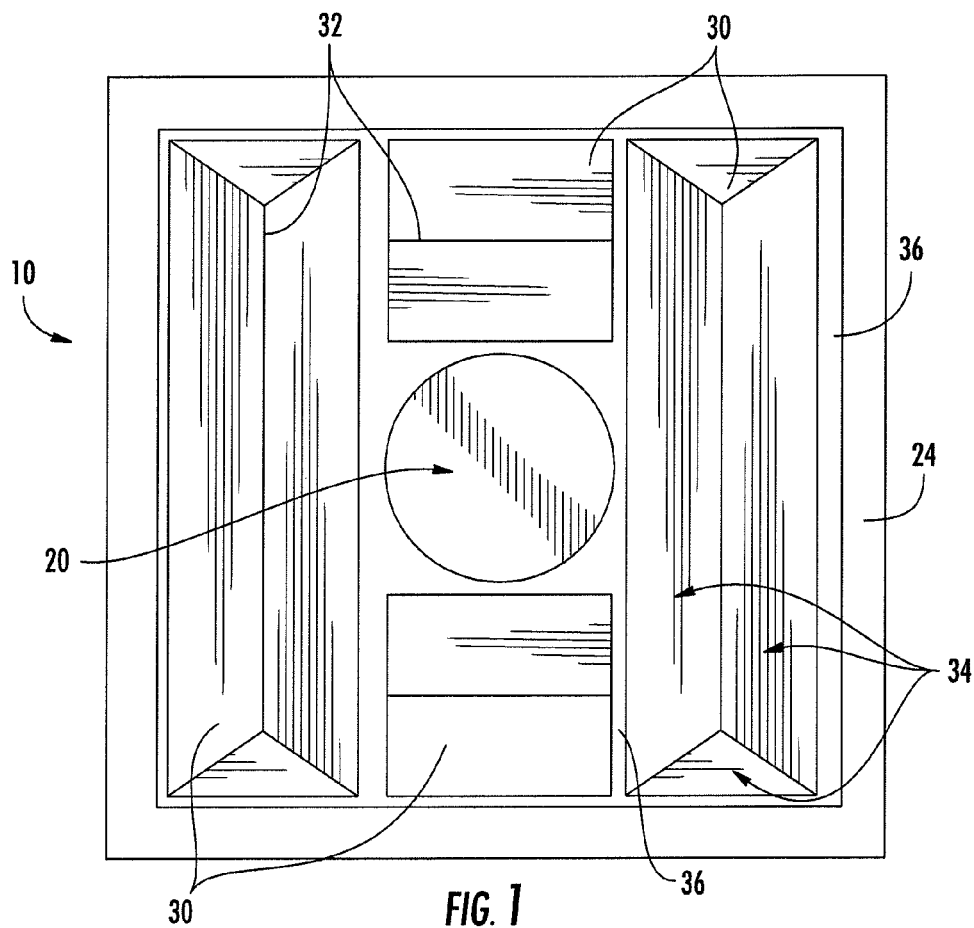
FIG. 1 illustrates a photo-conducting infrared sensor (e.g., infrared detecting pixel structure) according to one embodiment of the present invention including a single row of trenches surrounding a center electrode.

The present invention now will be described more fully hereinafter with reference to the accompanying drawings, in which some, but not all embodiments of the inventions are shown. Indeed, this invention can be embodied in many different forms and should not be construed as limited to the embodiments set forth herein; rather, these embodiments are provided so that this disclosure will satisfy applicable legal requirements. As used in the specification, and in the appended claims, the singular forms "a", "an", "the", include plural referents unless the context clearly dictates otherwise.

In one aspect, embodiments of the present invention are directed to infrared photo-conducting sensors. Rather than using conventional thin film techniques for photo-conducting thin films, however, embodiments of the present invention include surface topology created on the substrate in the form of trenches. In certain embodiments, the trenches comprise a v-shape or inverted pyramid. A series of conforming thin films can be deposited over the top of the surface of the substrate having the surface topology created thereon. The series of conforming thin films, in accordance with certain embodiments of the present invention, can include an infrared-reflective film, a photo-conducting sensing film (e.g., a lead chalcogenide film including, for example, PbSe, PbS or PbTe), or both. In certain preferred embodiments, the infrared-reflective film is disposed underneath the photo-conducting sensing film and directly or indirectly sandwiched between the substrate and the photo-conducting sensing film. In this regard, the infrared-reflective film functions as a backside reflector such that uncollected photons (e.g., photons not absorbed by the photo-conducting sensing film) are reflected back through the photo-conducting sensing film. Such configurations, therefore, greatly improve the sensitivity of the infrared photo-conducting sensors.

In accordance with certain embodiments of the present invention, infrared photo-conducting sensors (including infrared focal plane arrays) include a substrate (e.g., silicon) comprising a first surface including one or more trenches formed therein. The formed trenches can be provided in a variety of depths, configurations, frequency, and steepness. In certain embodiments, the trenches include planar faces connecting ridges (e.g., outermost peaks of the formed trenches) to valleys (e.g., the portion of the trench most deeply recessed into the substrate) positioned between respective ridges and recessed into the substrate by a selected depth. The planar faces are angled from the respective valleys of the trenches to the respective ridges. That is, the planar faces connecting the ridges and valleys are not perpendicular to a pre-surface topology formed surface (e.g., the generally flat outer surface prior to the formation of the trenches). In certain embodiments, an infrared-reflective film can be located/deposited directly or indirectly onto the first surface of the substrate (i.e., the surface having surface topology formed thereon). For instance, the infrared-reflective film can be directly deposited onto the substrate or indirectly deposited onto the substrate via a tie- or -adhesive layer, for example, positioned between the substrate and the infrared-reflective film. Alternatively, a passivation layer can be provided between the infrared-reflective film and the substrate surface having the surface topology created thereon. Preferably, the infrared-reflective film conforms in shape with the first surface of the substrate (i.e., the substrate surface including the surface topology created thereon). In certain preferred embodiments, a lead chalcogenide (e.g., PbSe, PbS, PbTe) film can be located/deposited directly or indirectly over the top of the infrared-reflective film. That is, the lead chalcogenide film can be positioned directly onto the infrared-reflective film or an intermediate film (if desired) can be positioned between the lead chalcogenide film and the infrared-reflective film. Similar to the infrared-reflective film, the lead chalcogenide film also preferably conforms in shape with the first surface of the substrate (i.e., the surface having surface topology formed thereon). In such embodiments, therefore, the infrared-reflective film is directly or indirectly sandwiched between the substrate and the lead chalcogenide film.

In certain preferred embodiments, the lead chalcogenide film includes materials such as lead sulfide, lead selenide, lead telluride, and/or lead/tin mixtures of these chalcogenides. As used herein, the term "lead chalcogenide" can include: lead sulfide, lead selenide, lead telluride and mixtures thereof. Additionally, other Group IVB metals, such as germanium and tin, can also be present as their chalcogenides in accordance with certain embodiments of the present invention. These families of compositions have the chemical formulae $PbS_{1-x-y}Se_xTe_y$, wherein x and y can have values from 0 to 1 and x+y must be less than or equal to 1, and $Pb_bM_{1-b}S_{1-x-y}Se_xTe_y$, wherein b can have a value from 0 to 1 and M is tin. Elements such as germanium can be incorporated, if desired, as a dopant at levels as low as parts per trillion in order to modify the electrical properties of the lead chalcogenide. Lead salts, especially lead selenide and lead sulfide materials, provide some of the most sensitive materials for detecting infrared energy at certain wavelengths. An infrared detector utilizing these materials can comprise a thin film of these materials on a substrate with electrical leads connected to opposite sides, for example only, of the thin film or layer. Alternatively, one of the electrical leads can be connected to a central portion of a pixel and the other electrical lead can be provided around the periphery of the pixel.

In certain embodiments, the thickness of the lead chalcogenide film can comprise from at least any of the following: 1, 2, 3, 4, and 5 microns and/or at most about any of the following 8, 7, 6, and 5 microns (e.g., 1-8 microns, 1-5 microns, 3-5 microns, etc.)

The term "infrared-reflective film" as used herein generally includes materials that can reflect a majority, preferably all, of infrared radiation passing through the lead chalcogenide film. Suitable materials for forming the infrared-reflective film include a single layer or multi-layer stacks of polymers or metals such as aluminum, titanium, tungsten, or platinum.

In certain embodiments, the thickness of the infrared-reflective film can comprise from at least any of the following: 1, 2, 3, 4, and 5 microns and/or at most about any of the following 8, 7, 6, and 5 microns (e.g., 1-8 microns, 1-5 microns, 3-5 microns, etc).

The surface topology created on the surface of the substrate (e.g., the trench structure formed in/on the first surface of the substrate) provides at least two primary benefits. First, the additional topology (e.g., trench structures) increases the adhesion strength by providing a larger surface area for adherence of the films onto the substrate. As note previously, the adhesion strength of lead-based sensing films is poor for conventional chemically-deposited semiconducting sensor films. Secondly, because the slopes of the trenches are at an angle of at least 45 degrees or steeper (e.g., 45 degrees to 80 degrees), normally incident photons pass through the sensor at least 4 times, greatly enhancing the overall quantum efficiency of the device.

Conventional thin film photo-conducting devices configured either as focal plane arrays or single-element detectors are deposited on flat substrates. With this configuration, photons penetrate the semiconductor, generating electrons and holes which then form a current when bias is applied. Since the penetration of light is much deeper than the film thickness, some photons, and indeed most, are wasted by being passed out the backside of the detector without generating any carriers. However, in accordance with certain embodiments of the present invention, an infrared-reflecting surface (e.g., film) is incorporated behind the absorbing lead chalcogenide film (such as PbSe, PbS, or PbTe). The uncollected photons (e.g., photons that are passed through the lead chalcogenide film) reflect and make a second pass through the detector, improving the overall sensitivity of the device. If, for example, a typical nano-crystalline PbSe film exhibits a 15% quantum efficiency (e.g., only the gathered photons, A=15%), and 85% of incident photons pass through unregistered. However, when an infrared reflector (e.g., film) is incorporated underneath/behind the lead chalcogenide film, the number of gathered photons becomes A(2 passes)=0.15+0.15*0.85=28%.

Furthermore, in certain embodiments the devices/sensors also make use of a three dimensional reflecting structure which allows photons to not only pass through the lead chalcogenide film once or twice, but photons can make 4 passes through the lead chalcogenide material for any incident photon. Hence, in the present example, the gathered photon percentage increases to A (4 passes)=0.28+0.15*0.72+0.15*0.61=48% absorbed. Accordingly, such embodiments provide a quantum efficiency that this is more than triple current devices. These combination of features directly leads to substantially improved response and hence detectivity. In various applications, therefore, the benefits include a higher resolution focal plane array with increased range.

The improvements realized by certain embodiments of the present invention can be understood, at least partially, by first noting that a ray of light impinging onto the side of a sloped trench will tend to scatter laterally into the facing surface. The light path, therefore, is through the lead chalcogenide film, to the backside reflector (e.g., the infrared-reflective film) and out again through the same lead chalcogenide film, then across to the opposing facing trench wall, into the backside reflector (e.g., the infrared-reflective film) and back out again for a total of four passes through the lead chalcogenide film.

Moreover, it should also be noted that there exists an additional benefit of increased path length within each pass because the incoming light is no longer crossing through the film in an orthogonal path but at an angle. By way of example only, a sensor according to certain embodiments can include trenches comprising flat planar faces (e.g., facets) comprising a 55° slope. In such embodiments, therefore, the length for each pass would be increased by a factor of L'=1/cos(55°) =1.74 (i.e., 74%). This effect is mitigated, however, by the refractive properties of the film(s) being much higher than the refractive index of air from which the irradiation comes. Snell's law shows then that the light is bent toward orthogonal such that $$Sin(\alpha)=Sin(55°)*[n(air)/n(PbSe)]=>\alpha=9.4°;$$

where n(air)=1; n(PbSe)=5.

Considering refraction, therefore, the path length increases to L=1/cos(9.4°), or a 1.4% increase for each pass with the exemplary embodiments discussed herein.

When the flat planar surface of the trenches are sloped in the manor described herein, at an angle of, for example only of 55 degrees, the total surface area in the same size pixel is enhanced by a factor of 1/cos(55)=1.74 (e.g., yielding a 74% increase in adhesion strength).

In one embodiment, as illustrated in FIG. 1, the design of the device includes a single row of v-shaped trenches positioned between two contacts (i.e., a center electrode and a peripheral electrode) of the photo-conducting pixel. The sensor shown in FIG. 1 includes a single pixel (e.g., a single infrared detecting pixel structure) 10 including a center electrode 20 at least partially surrounded by one or more trenches 30 and a peripheral electrode 24 at least substantially surrounding the one or more trenches 30. In the embodiment illustrated by FIG. 1, four separate and discrete trenches 30 are formed/located around and substantially surrounding the center electrode 20 and the peripheral electrode 24 completely surrounds the plurality of trenches. The trenches 30 include respective valleys 32 for each trench being recessed into the substrate by facets 34 formed in or onto the substrate and extending to respective ridges 36. FIG. 1 illustrates an embodiment in which only a single row of v-shaped trenches are utilized to substantially surround the center electrode. In certain embodiments, however, a pixel structure can include multiple rows of trenches. An individual pixel structure, for example, can comprise from 1 to about 10 rows of trenches (e.g., 1 to 8, 2 to 8, 2-5, or 3 to 5 rows of trenches). For instance, a pixel structure several times the wavelength in size can include several rows of trenches (e.g., a 60 micron pixel can have from 1 to 10 rows of trenches).

In certain embodiments, the surface area associated with the v-shaped trenches, as illustrated in FIG. 1, in a single infrared detecting pixel structure can comprise from about 80% by area to about 100% by area (e.g., 80%-99%, 85%-99%, 90%-99%, 95%-99%, 85%-100%, 90%-100%, or 95%-100%).

Figure 2:
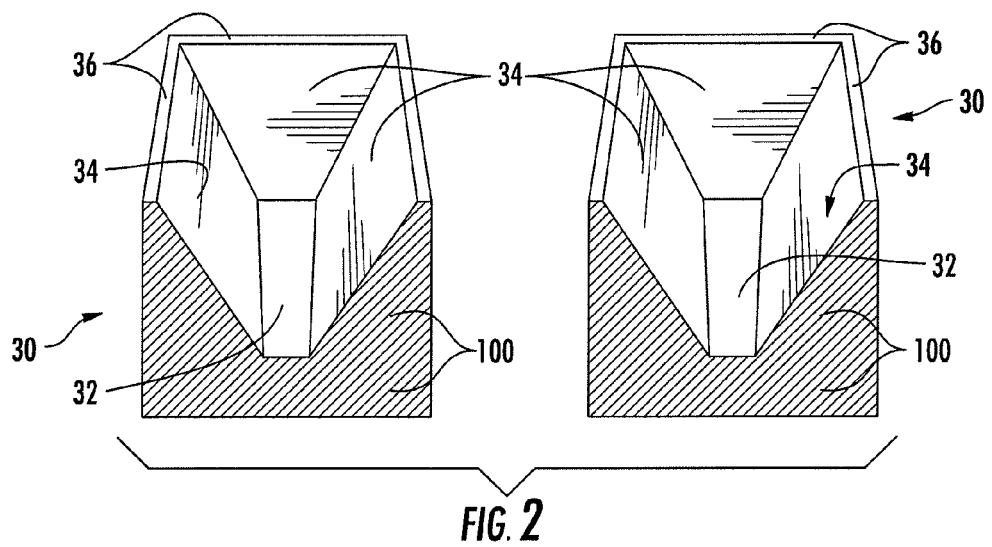
FIG. 2 illustrates a cross-sectional view of v-shaped trenches formed in a silicon substrate in accordance with one embodiment of the present invention.

FIG. 2 illustrates a cross-sectional view of v-shaped trenches formed in a substrate 100 (e.g., silicon) in accordance with one embodiment of the present invention. As can be seen in this particular embodiment, each trench 30 includes a valley 32 recessed into the substrate 100 and corresponding ridges 36 surrounding each valley 32. Each valley 32 is connected to respective ridges 36 by flat planer surfaces or facets 34 formed in or on the substrate 100. The flat planar surfaces 34 are provided at an angle or at least 45 degrees from the horizontal plane including the valley. Although FIG. 2 illustrates an embodiment in which the valleys 32 include a small horizontal width, valleys in certain embodiments of the present invention can comprise a simple line defined by an array of points where opposing planar faces 34 join or intersect (e.g., where the planar faces meet). In this regard, incoming radiation can be passed through the photo-conducting material up to four times.

Figure 3:
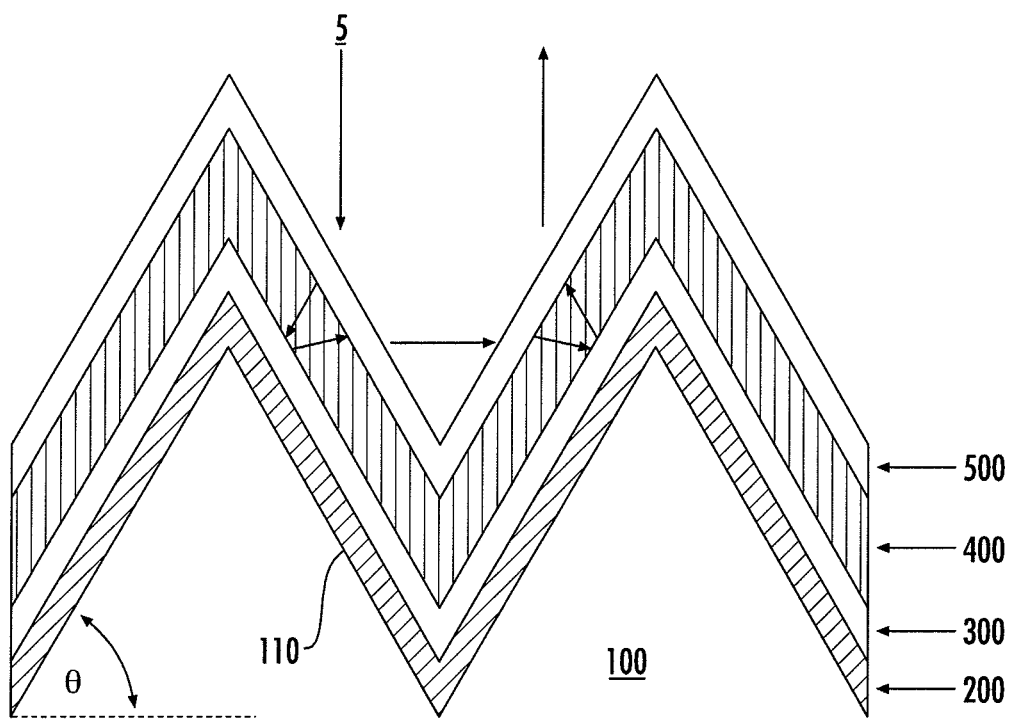
FIG. 3 illustrates a cross-sectional schematic of multiple conforming films deposited onto a substrate having surface topology created therein in the form of v-shaped trenches in accordance with certain embodiments of the present invention.

FIG. 3 illustrates a cross-sectional schematic of multiple conforming films deposited onto a substrate 100 having surface topology created therein (or thereon) in the form of v-shaped trenches 30 in accordance with certain embodiments of the present invention. The substrate 100 can be formed of a variety of dielectric materials typically utilized in the fabrication of photo-conducting sensors. Suitable materials, for example, include silicon, quartz, $Al_2O_3$, sapphire, germanium, glass, and the like. The embodiment shown in FIG. 3 includes a substrate 100 including a first surface 110 having topography in the form of v-shaped trenches formed therein. An optional passivation layer (e.g., $SiO_2$) 200 has been deposited directly onto and conforms in shape to the first surface 110 of the substrate 100. An infrared-reflective film 300 has been deposited over the top of the optional passivation layer 110 and also conforms in shape with the first surface 110 of the substrate 100. In this particular embodiment, therefore, the infrared-reflective film 300 can be considered to be indirectly deposited onto the first surface 110 of the substrate 100. It should be noted, however, that the infrared-reflective film 300 can be deposited directly onto the first surface 110 of the substrate 100 in which case the infrared-reflective film can be considered to be directly deposited onto the first surface of the substrate. In the particular embodiment illustrated in FIG. 3, a lead chalcogenide film 400 is deposited/positioned directly onto (e.g., over the top) of the infrared-reflective film 300 and conforming in shape with the first surface 110 of the substrate 100. Accordingly, the infrared-reflective film 300 is sandwiched between the substrate 100 and the lead chalcogenide film 400. Although FIG. 3 shows the lead chalcogenide film 400 deposited directly onto the infrared-reflective film 300, in some embodiments, a suitable intermediate layer (e.g., a tie-layer) can be provided if so desired. FIG. 3 also illustrates an embodiment in which an optional overcoat layer 500 is present. The optional overcoat layer 500 can comprise a passivation layer or an anti-reflective film to facilitate entry of the light (e.g., infrared radiation) 5 into the sensor 10 by mitigating the amount of light reflected off of the sensor prior to passing through the lead chalcogenide film 400. Suitable materials for an anti-reflective film, according to certain embodiments of the present invention, can include ZnSe, ZnS, $SiO_2$, and Si provided in single or multi-layer stacks.

The embodiment illustrated in the FIG. 3 includes the lead chalcogenide film 400 deposited directly over the top of the infrared-reflective film 300 and the infrared-reflective film deposited indirectly onto the first surface 110 of the substrate (i.e., the surface having the topography formed thereon/therein) 100. Accordingly, this particular embodiment includes the infrared-reflective film 300 located such that this film is indirectly sandwiched between the substrate 100 and the lead chalcogenide film 400. In other embodiments, however, the infrared-reflective film 300 can be directly deposited onto the first surface 110 of the substrate 100 and the lead chalcogenide film 400 can be, in turn, directly deposited onto the infrared-reflective film such that the infrared-reflective film is directly sandwiched between the substrate and the lead chalcogenide film.

Figure 4:
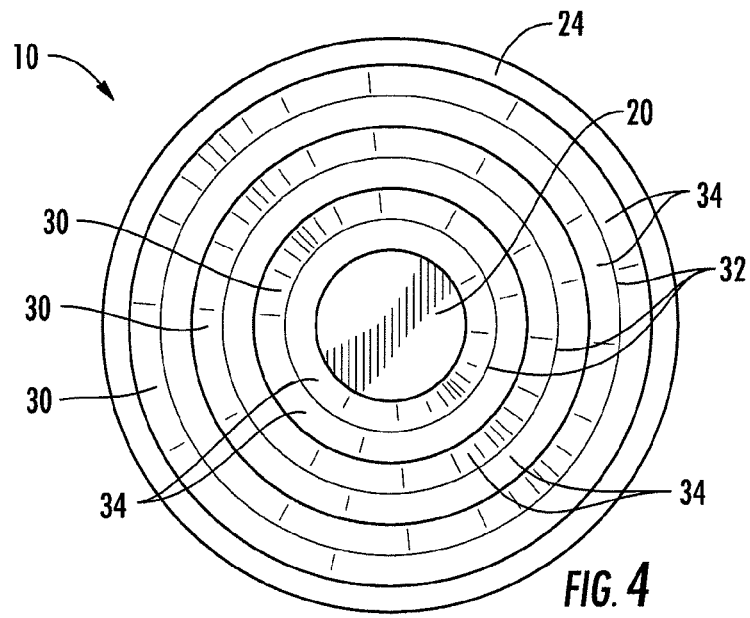
FIG. 4 illustrates a circular photo-conducting infrared sensor (e.g., infrared detecting pixel structure) according to one embodiment of the present invention including a plurality of circular concentric trenches located between a center electrode and a peripheral electrode.

FIG. 4 illustrates a circular photo-conducting infrared sensor (e.g., infrared detecting pixel structure) 10 according to one embodiment of the present invention including a plurality of circular concentric trenches 30 located between a center electrode 20 and a peripheral electrode 24. The embodiment illustrated in FIG. 4 includes three rows of v-shaped trenches 30, each having a respective valley 32 connected to ridges 36 by facets 34, formed as concentric circles around a center contact or electrode 20 with an outer contact or electrode 24 surrounding the pixel structure. Although FIG. 4 illustrates an embodiment with three trenches 30, one or multiple trenches can be wrapped around in the shape of a doughnut between the two contacts/electrodes 20, 24. An individual pixel structure, for example, can comprise from 1 to about 10 rows of such circular concentric trenches (e.g., 1 to 8, 2 to 8, 2-5, or 3 to 5 rows of trenches). For instance, a pixel structure several times the wavelength in size can include several rows of trenches (e.g., a 60 micron pixel can have from 1 to 10 rows of trenches).

In certain embodiments, the surface area associated with the circular v-shaped trenches 30, as illustrated in FIG. 4, in a single infrared detecting pixel structure can comprise from about 80% by area to about 100% by area (e.g., 80%-99%, 85%-99%, 90%-99%, 95%-99%, 85%-100%, 90%-100%, or 95%-100% by area).

Figure 5:
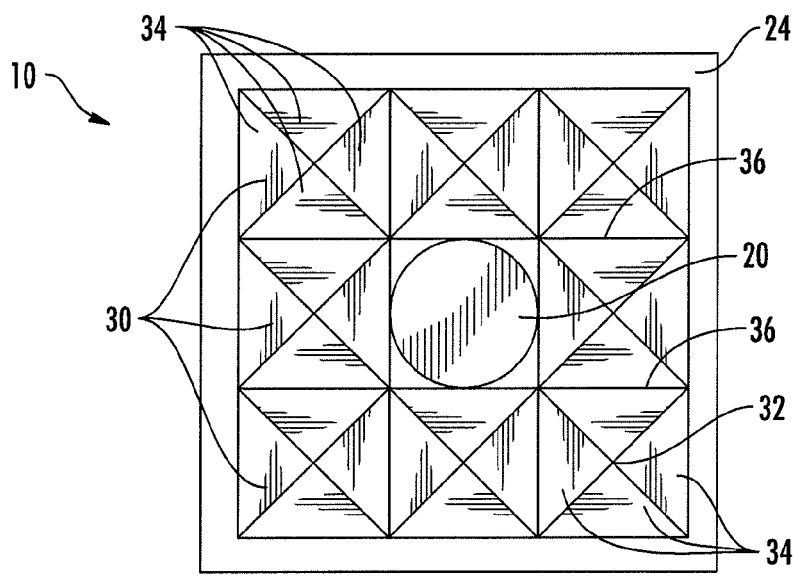
FIG. 5 illustrates surface topology created in a substrate in the form of inverted pyramids recessed into the substrate.

Although FIGS. 1 and 4 illustrate embodiments including trenches 30 in the form of v-shaped divots or grooves, FIG. 5 illustrates an embodiment similar to that illustrated by FIG. 1 except the embodiment shown in FIG. 5 includes trenches 30 having an inverted pyramid shape in which the point 9 (valley) of the pyramid shape is recessed into the substrate. In the particular embodiment illustrated in FIG. 5, the sensor (e.g., infrared detecting pixel structures) 10 includes a single row of inverted pyramid type trenches 30 surrounding a center electrode 20. In certain embodiments, however, the number of rows surrounding the center electrode 20 can vary from 1 row to about 5 rows or more (e.g., 10 rows). Each trench illustrated in FIG. 5 includes a single point as a valley 32 and is surrounded by four flat planar faces (e.g., facets) 34 formed in the substrate and extending outward to respective ridges 36.

In certain embodiments, the surface area associated with the inverted pyramid type trench structures in a single infrared detecting pixel structure can comprise from about 80% by area to about 100% by area (e.g., 80%-99%, 85%-99%, 90%-99%, 95%-99%, 85%-100%, 90%-100%, or 95%-100% by area).

Figure 6:
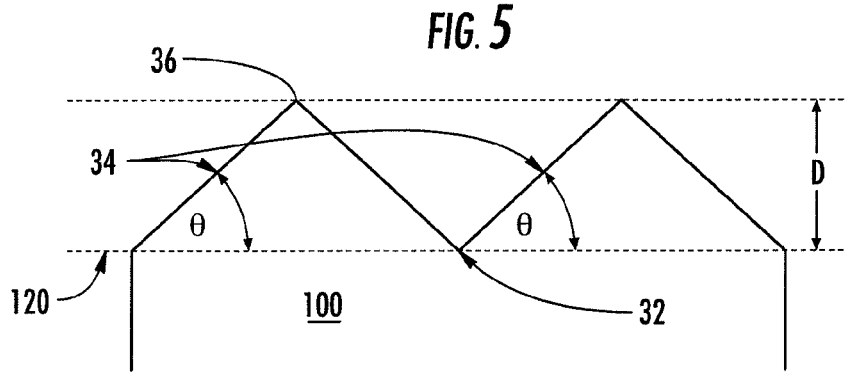
FIG. 6 illustrates a cross-sectional schematic of a substrate having surface topology created thereon and illustrating the depth and steepness of the trenches.

FIG. 6 illustrates a cross-sectional schematic of a substrate 100 having surface topology created thereon and illustrating the depth (as represented by "D") and steepness (as represented by angle θ) of trenches in accordance with embodiments of the present invention. As shown in FIG. 6, the angle of the flat planar faces 34 of the trenches is provided at an angle "θ" from a horizontal plane 120 including the valley 32 of the trench illustrated. The angle (or steepness) of the trenches can vary from about 45 degrees to about 85 degrees (e.g., 45-75, 45-65 degrees). In certain embodiments, the angle "θ" (as illustrated in FIG. 6) can comprise from at least any of the following: 45, 50, 55, 60, and 70 degrees and/or at most about any of the following 85, 80, 75, and 70 degrees.

The depth (as represented by "D" in FIG. 6) of the one or more trenches in certain embodiments according to the present invention can comprise from about 5 microns to about 20 microns. In certain embodiments, the depth "D" (as illustrated in FIG. 6) can comprise from at least any of the following: 1, 2, 3, 4, 5, 6, 7, 8, 9, and 10 microns and/or at most about any of the following 20, 18, 16, 14, 12, and 10 microns (e.g., 5-20 microns, 8-12 microns, etc.).

In another aspect, the present invention provides linear and focal plane arrays. In certain embodiments, focal plane arrays for detecting infrared radiation comprise a plurality of infrared detecting pixel structures as previously described and illustrated in FIGS. 1-6. At least one of said plurality of infrared detecting pixel structures (and in certain embodiments all pixel structures) comprise a substrate comprising a first surface including one or more trenches (i.e., the surface has surface topology formed thereon in the form of various shaped trenches). An infrared-reflective film can be located/deposited directly or indirectly onto the first surface of the substrate (i.e., the surface having surface topology formed thereon) and can conform in shape with the first surface of the substrate. A lead chalcogenide (e.g., e.g., PbSe, PbS, PbTe) film can be located/deposited directly or indirectly over the top of the infrared-reflective film. Similar to the infrared-reflective film, the lead chalcogenide film can also conform in shape with the first surface of the substrate (i.e., the surface having surface topology formed thereon). In certain embodiments, the focal plane arrays include electrical couplers providing an electrical connection of each pixel structure to a measurement circuitry unit as is generally known by one of skill in the art.

Figure 7:
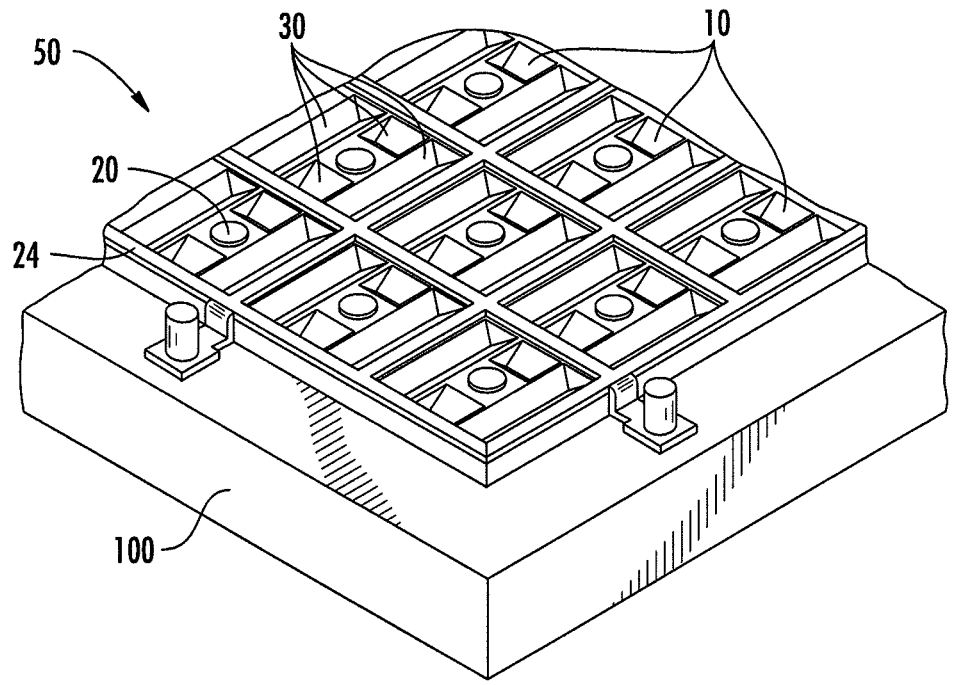
FIG. 7 illustrates a focal plane array according to one embodiment of the present invention including multiple infrared detecting pixel structures having v-shaped trenches and including respective center electrodes and an electrically conductive grid forming respective peripheral electrodes for each of the pixel.
Figure 8:
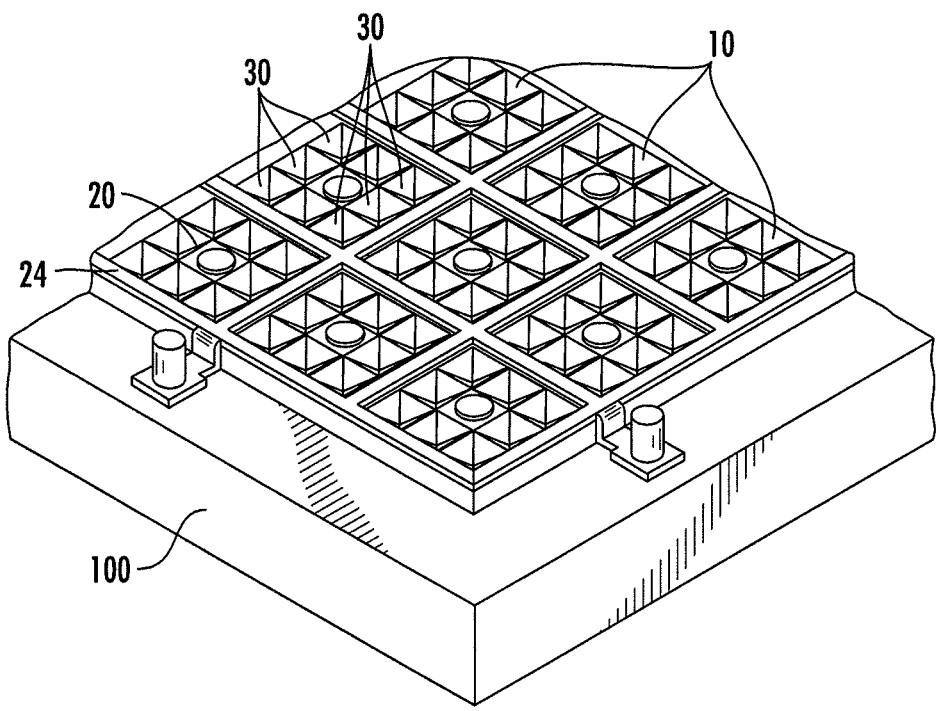
FIG. 8 illustrates a focal plane array similar to that shown in FIG. 7, but utilizing trenches shaped as inverted pyramids.

FIG. 7 illustrates a focal plane array 50 according to one embodiment of the present invention including multiple infrared detecting pixel structures 10 having v-shaped trenches 30 and including respective center electrodes 20 and an electrically conductive grid 24 forming respective peripheral electrodes for each of the pixel structures 10. FIG. 8 illustrates a focal plane array 50 similar to that shown in FIG. 7, but utilizing trenches 30 shaped as inverted pyramids. In FIGS. 7 and 8, the electrical couplers comprise a respective pair or electrical contacts/electrodes 20, 24 for each infrared detecting pixel structure 10. More specifically, FIGS. 7 and 8 show embodiments in which the electrical couplers comprise a respective center electrode 20 located in the center of each infrared detecting pixel structure 10 and a conductive grid 24 disposed directly or indirectly over the top of the lead chalcogenide film defining respective periphery electrodes of each infrared detecting pixel structure. In certain embodiments, the respective center electrodes 20 are electrically interconnected (not shown).

In certain embodiments, the focal plane array can comprise discontinuities in the lead chalcogenide film corresponding in location to the electrically conductive grid such that at least a portion of the infrared detecting pixel structures are physically discrete detector elements. In such embodiments, therefore, the respective infrared detecting pixel structures can be both electrically and physically separate. However, in certain embodiments the lead chalcogenide film can be continuous (e.g., devoid of physical discontinuities). In such embodiments, the electrically conductive grid effectively separates the lead chalcogenide film into electrically, but not physical, discrete detection areas.

Although FIG. 7 illustrates a focal plane array 50 having all of the individual infrared detecting pixel structures 10 having v-shaped trenches 30 and FIG. 8 illustrates a focal plane array 50 having all of the individual infrared detecting pixel structures 10 having inverted pyramid shaped trenches, a single focal plane array can have a mixture of individual infrared detecting pixel structures incorporating a variety of topographies (e.g., a single focal plane array can include some pixel structures with v-shaped trenches and other pixel structures with inverted pyramid trenches). Moreover, an individual infrared detecting pixel structure can comprise a mixture of such trench shapes within the same pixel structure.

Figure 9:
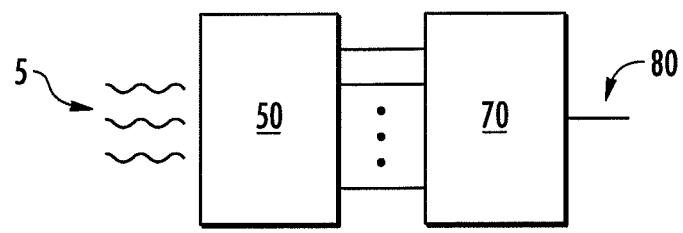
FIG. 9 illustrates a focal plane array in electrical connection with a measurement circuitry unit, such as a read-out integrated circuit (ROIC)

FIG. 9 illustrates a focal plane array 50 in accordance with one embodiment of the present invention in electrical connection with a measurement circuitry unit 70, such as a readout integrated circuit (ROIC), as is generally known in the art. In general, the focal plane array 50 receives infrared radiation 5 from a scene that is to be imaged and produces signals that represent the scene. The signals may be used to produce an image of the scene on a display, to perform object recognition, or any other appropriate task. In FIG. 9, the focal plane array 50, which is composed of a plurality of individual infrared detecting pixel structures according to embodiments of the present invention are arranged in a two-dimensional array (not shown in FIG. 9), detects the infrared radiation 5 from the scene and produces signals representative of the infrared radiation in the scene. Thus, the focal plane array produces signals that vary in current as the impinging infrared radiation varies. The measurement circuitry unit 70 such as ROIC, to which the focal plane array can be hybridized or integrated monolithically, detects the signals from focal plane array, processes them, and can place the processed signals on a data link 80, so that they may be processed further, such as for image extraction or viewing on a display. The electrical connection of photo-conducting infrared sensors, including linear and focal plane arrays, can be completed in a variety of ways as is well known in the art.

Embodiments of the present can be fabricated using a variety of techniques. For a crystalline silicon substrate, by way of example, anisotropic etching of crystal facets (i.e., flat planar faces of the trenches) using for example, TMAH-based (Tetramethylammonium hydroxide) wet etching can be used. Known KOH wet etching techniques which preferentially attack silicon crystal planes can also be employed if desired. More generally, imprint lithography can be used to fashion sloped photoresist profiles whose shapes are transferred into the substrate during nonselective reactive ion etching. For pixels, for example, on the order of about 30-600 microns per edge, useful trenches can be on the order of 10 microns deep as discussed previously.

Figure 10:
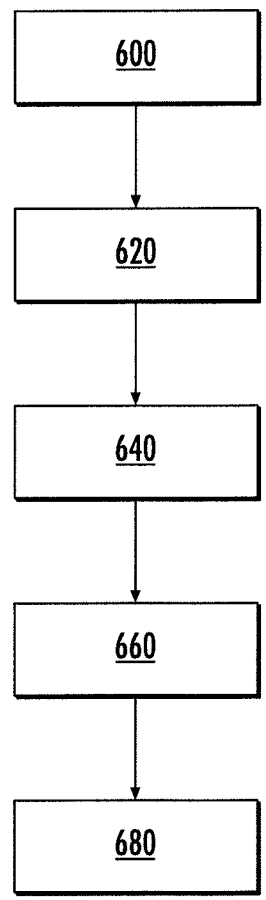
FIG. 10 illustrates a flow chart for methods of fabricating embodiments of the present invention.

Once the desired topography has been imparted onto/into a surface of the selected substrate material, the fabrication of embodiments can be carried-out by a variety of conventional techniques known in the art. As illustrated in FIG. 10, for instance, fabrication of embodiments according to the present invention can generally comprise steps of (1) forming the desired topography onto/into a surface of the selected substrate 600; (2) optionally depositing a passivation layer directly onto the surface of the substrate having the desired topography formed thereon/therein 620; (3) depositing an infrared-reflective film directly or indirectly onto the substrate 640; (4) depositing a lead chalcogenide film directly or indirectly over the top of the infrared-reflective film 660; and (5) optionally depositing an outer coating comprising a passivation layer or infrared anti-reflective layer directly or indirectly over the top of the lead chalcogenide film 680.

In certain embodiments, sensors (including linear and focal plane arrays) can be fabricated according to the methods described in EP 1,852,920 A1 (the contents of which are hereby incorporated by reference) after formation of the desired topography on the substrate and wherein an infrared-reflective film is deposited directly or indirectly onto the substrate prior to deposition of the lead chalcogenide film to ensure that the an infrared-reflective film is directly or indirectly sandwiched between the substrate and the lead chalcogenide film. As described in EP 1,852,920 A1, the incorporation of metal contacts in photo-conducting infrared sensors is well known in the art by standard procedures (e.g., standard mechanical and photolithographic techniques).

Moreover, the deposition conditions (e.g., suitable operating conditions and techniques) of the respective films in embodiments of the present invention are well known in the art. For instance, standard techniques such as thermal evaporation in vacuum, sputtering, Chemical Vapor deposition, and Plasma Enhanced Chemical Vapor Deposition can be used to deposit each of the layers in accordance with certain embodiments of the present invention.

In certain preferred embodiments, sensors (including linear and focal plane arrays) can be fabricated by forming trenches (e.g., V-shaped trenches, inverted pyramid trenches, etc.) by established techniques such as those discussed previously followed by depositing an insulation passivation layer of silicon dioxide (e.g., by PECVD). After deposition of the insulating passivation layer an infrared-reflective film or layer (e.g., aluminum) can be deposited onto at least a portion of the insulating passivation layer by known sputtering techniques. Next, an infrared absorbing layer (e.g., a lead chalcogenide film, preferably comprising PbSe) can be deposited onto at least a portion of the infrared-reflective film by known evaporation or wet chemical deposition processes. Preferably, a passivation and anti-reflecting coating (e.g., a multilayer stack of Si/SiO2) is deposited by known sputtering techniques over at least a portion of the infrared absorbing layer (e.g., a lead chalcogenide film, preferably comprising PbSe). As a final step, contacts are formed and interconnected to ROIC (for example) by standard pattern, etch, and deposition techniques.

Many modifications and other embodiments of the invention set forth herein will come to mind to one skilled in the art to which these inventions pertain having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A photo-conducting infrared sensor, comprising:
   (i) a substrate comprising a first surface including one or more trenches;
   (ii) an infrared-reflective film deposited directly or indirectly onto and conforming in shape with the first surface of the substrate; and
   (iii) a lead chalcogenide film deposited directly over the top of the infrared-reflective film and conforming in shape with the first surface of the substrate such that the infrared-reflective film is directly or indirectly sandwiched between the substrate and the lead chalcogenide film.

2. The sensor according to claim 1, wherein the infrared-reflective film is directly deposited onto and conforming in shape with the first surface of the substrate.

3. The sensor according to claim 1, further comprising a center electrode at least partially surrounded by said one or more trenches and a peripheral electrode at least substantially surrounding the one or more trenches.

4. The sensor according to claim 3, wherein from about 1 to about 5 rows of trenches encircle the center electrode.

5. The sensor according to claim 1, further comprising at least one pair of electrical contacts.

6. The sensor according to claim 1, wherein the one or more trenches comprise a pair of planar faces forming a v-shape.

7. The sensor according to claim 1, wherein the one or more trenches comprise planar faces forming an inverted pyramid.

8. The sensor according to claim 1, wherein the one or more trenches comprise a steepness from about 45 degrees to about 75 degrees.

9. The sensor according to claim 1, wherein the lead chalcogenide film comprises lead sulfide, lead selenide, or lead telluride.

10. The sensor according to claim 1, wherein the one or more trenches comprise a depth from about 5 microns to about 20 microns.

11. The sensor according to claim 1, wherein the sensor comprises a single-element detector.

12. A focal plane array for detecting infrared radiation, comprising:
   (i) a plurality of infrared detecting pixel structures; and
   (ii) electrical couplers providing an electrical connection of each pixel structure to a measurement circuitry unit;
   (iii) at least one of said plurality of infrared detecting pixel structures comprises (a) a substrate comprising a first surface including one or more trenches; (b) an infrared-reflective film deposited directly or indirectly onto and conforming in shape with the first surface of the substrate; and (c) a lead chalcogenide film deposited directly or indirectly over the top of the infrared-reflective film and conforming in shape with the first surface of the substrate such that the infrared-reflective film is directly or indirectly sandwiched between the substrate and the lead chalcogenide film.

13. The focal plane array according to claim 12, wherein all of the said plurality of infrared detecting pixel structures comprise (a) a substrate comprising a first surface including one or more trenches; (b) an infrared-reflective film deposited directly or indirectly onto and conforming in shape with the first surface of the substrate; and (c) a lead chalcogenide film deposited directly or indirectly over the top of the infrared-reflective film and conforming in shape with the first surface of the substrate such that the infrared-reflective film is directly or indirectly sandwiched between the substrate and the lead chalcogenide film.

14. The focal plane array according to claim 12, wherein the electrical couplers comprise a respective pair or electrical contacts for each infrared detecting pixel structure.

15. The focal plane array according to claim 12, wherein the electrical couplers comprise a respective center electrode located in the center of each infrared detecting pixel structure and a conductive grid disposed directly or indirectly over the top of the lead chalcogenide film defining respective periphery electrodes of each infrared detecting pixel structure.

16. The focal plane array according to claim 15, wherein the respective center electrodes are electrically interconnected.

17. The focal plane array according to claim 12, wherein the focal plane array comprises discontinuities in the lead chalcogenide film such that at least a portion of the infrared detecting pixel structures are physically discrete detector elements.

18. The focal plane array according to claim 12, wherein the one or more trenches comprise a steepness from about 45 degrees to about 75 degrees and a depth from about 5 microns to about 20 microns.

19. The focal plane array according to claim 12, wherein the one or more trenches comprise a plurality of planar faces forming a v-shape, an inverted pyramid, or combinations thereof.

20. A photo-conducting infrared sensor, comprising:
  (i) a substrate comprising a first surface including one or more trenches;
  (ii) an infrared-reflective film deposited directly or indirectly onto and conforming in shape with the first surface of the substrate;
  (iii) a lead chalcogenide film deposited directly or indirectly over the top of the infrared-reflective film and conforming in shape with the first surface of the substrate such that the infrared-reflective film is directly or indirectly sandwiched between the substrate and the lead chalcogenide film; and
  (iv) a center electrode at least partially surrounded by said one or more trenches and a peripheral electrode at least substantially surrounding the one or more trenches.

* * * * *